(12) United States Patent
Cadouri

(10) Patent No.: US 7,418,682 B1
(45) Date of Patent: Aug. 26, 2008

(54) METHOD AND MECHANISM FOR PERFORMING DRC PROCESSING WITH REDUCED PASSES THROUGH AN IC DESIGN

(75) Inventor: Eitan Cadouri, Cupertino, CA (US)

(73) Assignee: Cadence Design Sysyems, Inc., San Jose, CA (US)

( * ) Notice: Subject to any disclaimer, the term of this patent is extended or adjusted under 35 U.S.C. 154(b) by 290 days.

(21) Appl. No.: 11/229,325

(22) Filed: Sep. 15, 2005

Related U.S. Application Data

(60) Provisional application No. 60/610,923, filed on Sep. 16, 2004.

(51) Int. Cl.
*G06F 17/50* (2006.01)
*G06F 9/45* (2006.01)

(52) U.S. Cl. .............. 716/5; 716/4; 716/8; 716/19; 716/20; 716/21; 430/5; 430/30

(58) Field of Classification Search ............ 716/4, 716/5, 19–21, 8; 430/5, 30, 5.3
See application file for complete search history.

(56) References Cited

U.S. PATENT DOCUMENTS

| | | | |
|---|---|---|---|
| 5,689,433 A * | 11/1997 | Edwards | 716/2 |
| 7,000,208 B2 * | 2/2006 | Zhang | 716/11 |
| 2005/0172247 A1 * | 8/2005 | Papadopoulou et al. | 716/5 |

OTHER PUBLICATIONS

Holonyak, Jr., N. "I-I. The First 40 Years: Reminiscences of Some of DRC's Significant Events" IEEE Transactions on Electron Devices, Oct. 1982, vol. ED-29, No. 10, pp. 1659.

Khwaja, A.A. "Enhancing Extensibility of the Design Rule Checker of an EDA Tool by Object-Oriented Modeling" Proceedings of the 21st Annual International Computer Software and Applications Conference (COMPSAC '97), Washington, DC, Aug. 13-15, 1997, pp. 104-106.

Li, Q. et al. "Full Chip ESD Design Rule Checking" Proceedings of the 2001 IEEE Symposium on Circuits and Systems (ISCAS 2001), Sydney, NSW, Australia, May 6-9, 2001, vol. 5, pp. 503-506.

Luo, Z. et al. "An Edge-Endpoint-Based Configurable Hardware Architecture for VLSI CAD Layout Design Rule Checking" Proceedings of the 7th Annual IEEE Symposium on Field-Programmable Custom Computing Machines (FCCM '99), Napa Valley, CA, Apr. 21-23, 1999, pp. 158-167.

Nunes, R.B. et al. "A Novel Approach to Perform Circuit Verification Using Spans" Proceedings of the 38th Midwest Symposium on Circuit and Systems, Rio de Janeiro, BR, Apr. 13-16, 1995, vol. 1, pp. 334-337.

Park, J.-S. et al. "An Efficient Rule-Based OPC Approach Using a DRC Tool for 0.18μm ASIC" Proceedings of the IEEE 1st International Symposium on Quality Electronic Design, San Jose, CA, Mar. 20-22, 2000, pp. 81-85.

Suzuki, G. et al. "A Practical Online Design Rule Checking System" Proceedings of the 27th ACM/IEEE Design Automation Conference, Orlando, FL, Jun. 24-28, 1990, pp. 246-252.

* cited by examiner

*Primary Examiner*—Jack Chiang
*Assistant Examiner*—Nghia M Doan
(74) *Attorney, Agent, or Firm*—Vista IP Law Group LLP

(57) ABSTRACT

A method and mechanism is disclosed for performing a spacing rule DRC check that does not require an excessive number of passes through the IC design. In one approach, a two-pass approach is employed to perform a spacing check. In an approach, a polygons are associated with a family of related polygons.

21 Claims, 5 Drawing Sheets

METHOD AND MECHANISM FOR PERFORMING DRC PROCESSING WITH REDUCED PASSES THROUGH AN IC DESIGN

CROSS-REFERENCE TO RELATED APPLICATIONS

The present application claims the benefit of U.S. Provisional Application No. 60/610,923, filed on Sep. 16, 2004, which is hereby incorporated by reference in its entirety.

BACKGROUND AND SUMMARY

The invention relates to technology for implementing electronic design automation tools, and in particular, design tools for performing design rule checks (DRC) for an integrated circuit ("IC") design.

An IC is a small electronic device typically formed from semiconductor material. Each IC contains a large number of electronic components, e.g., transistors, that are wired together to create a self-contained circuit device. The components and wiring on the IC are materialized as a set of geometric shapes that are placed and routed on the chip material. During placement, the location and positioning of each geometric shape corresponding to an IC component are identified on the IC layers. During routing, a set of routes are identified to tie together the geometric shapes for the electronic components.

Spacing rules are established to ensure that adequate spacing exists between any two objects/shapes on the IC design. These rules are usually established by the foundry that will produce the IC chip. A DRC tool is used to check for violations of spacing rules on the IC design.

"Width-dependent" spacing rules may also be established for an IC design. With modern, advanced technology, the minimum spacing between two metals on the IC design may be relative to the width of the two metal shapes. For example, if the metal width is X, then the spacing between this metal with the next space to the adjacent metal may need to be distance d. If the metal width is 2x, then the spacing between this metal with the next space to the adjacent metal may need to be wider, e.g., a distance of 1.5d.

DRC tools may use a process called "undersize-oversize" to address this problem. By first undersizing the metal shapes, all metals below a designated size are eliminated. The remaining metals are then restored to their original sizes by using the oversizing process.

FIG. 1 illustrates an application of this technique. Shown are two metal objects 102a and 104. Object 102a has a width of "3a" and object 104 has a width of "a". During the undersize process, each object is reduced by a common shrinking factor, e.g., "a/2". After the undersize process, any object that falls below a minimum number is eliminated from the design.

Here, assume that the dotted shape within object 102a shows the remaining size of this object after the undersize process. Further assume that object 104 will be too small and will be eliminated after the undersize process. Therefore, remaining after the undersize process is an object 102b that is a reduced version of object 102a. Note that in the undersizing process, the angled corners for object 102a have not been retained in object 102b.

Next, an oversizing process is applied to restore object 102b back to its original size. Object 102c is shown restored back to the original size of object 102a. However, it is noted that the angled corners of object 102a have not been restored. An additional step is performed to add the original angled corners to produce the layout having object 102d, which has the size and shape of the original metal object 102a.

As is evident, a series of several passes (e.g., 4) is required to perform this type of process. With modern designs, it is likely that there will be multiple segments (e.g., three segments) to the design, and each segment will undergo the same process. This multiplies the number of passes through the design to perform this type of process (up to 12 passes, which is four passes for the undersize-oversize process multiplied by three for each of the three segments). Since each pass through the design consumes a significant amount of system resources, the more passes it takes to perform the process, the greater the negative impact to the system. In a modern IC design having many millions of objects to process, this type of process having requiring many passes through a design could consume an excessive amount of system resources.

Therefore, it is highly desirable to implement a method and mechanism for performing a spacing rule DRC check that does not require an excessive number of passes through the IC design. Embodiments of the invention provide an improved method and mechanism for performing a spacing rule DRC check that does not require an excessive number of passes through the IC design. In one embodiment, a two-pass approach is employed to perform a spacing check. In an embodiment, polygons are associated with a family of related polygons.

DETAILED DESCRIPTION

Figure 1:
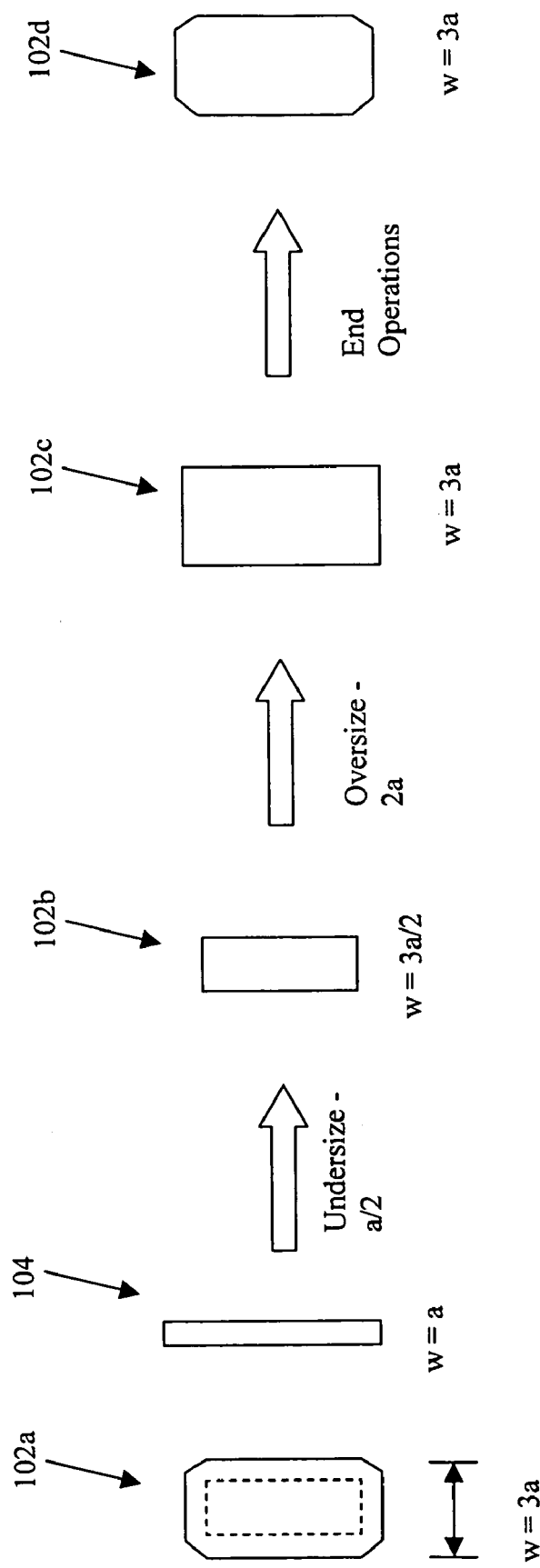
FIG. 1 illustrates an undersize-oversize DRC process in accordance with some embodiments of the invention.
Figure 2:
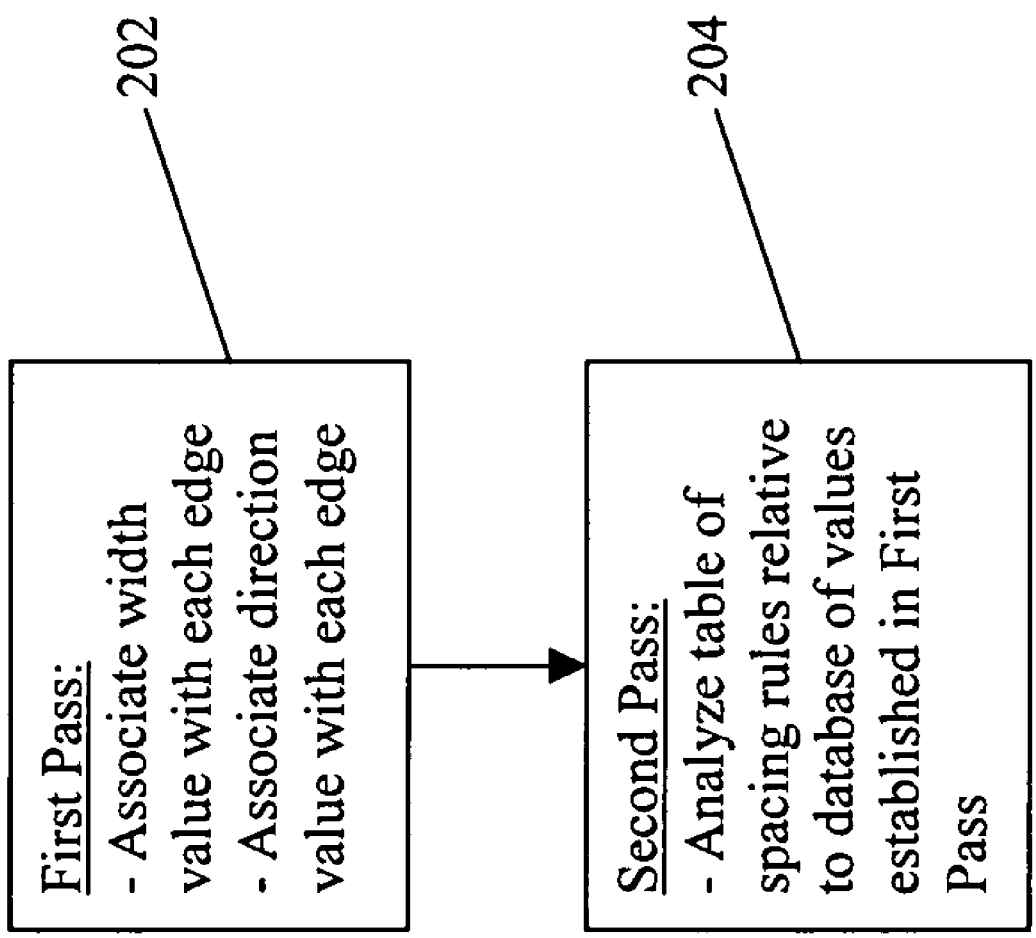
FIG. 2 shows a process flow of an two-pass approach for width-dependent spacing rule checking in a DRC tool in accordance with some embodiments of the invention.

FIG. 2 shows a process flow of an approach for width-dependent spacing rule checking in a DRC tool in accordance with some embodiments. The approach of FIG. 2 only uses 2 passes through the design, rather than the numerous passes, e.g., 12 passes, as required by the undersize-oversize process.

In the first pass 202 of the process of FIG. 2, the objects in the design are analyzed to identify the width value and directional value for each appropriate edge in the design. Once this action as been performed, a database of edge values will now exist for all relevant edges in the IC design.

A set of spacing rules is established for the design, which is likely based upon a set of design rules provided by the foundry that will be manufacturing the IC device. The set of spacing rules may exist in tabular form in one embodiment.

The second pass 204 through the IC design comprises a analysis of the database of edge values with respect to the set of spacing rules. Each set of corresponding edges (which are identified based upon the directional value for the edges) are matched against the set of spacing rules.

Figure 3:
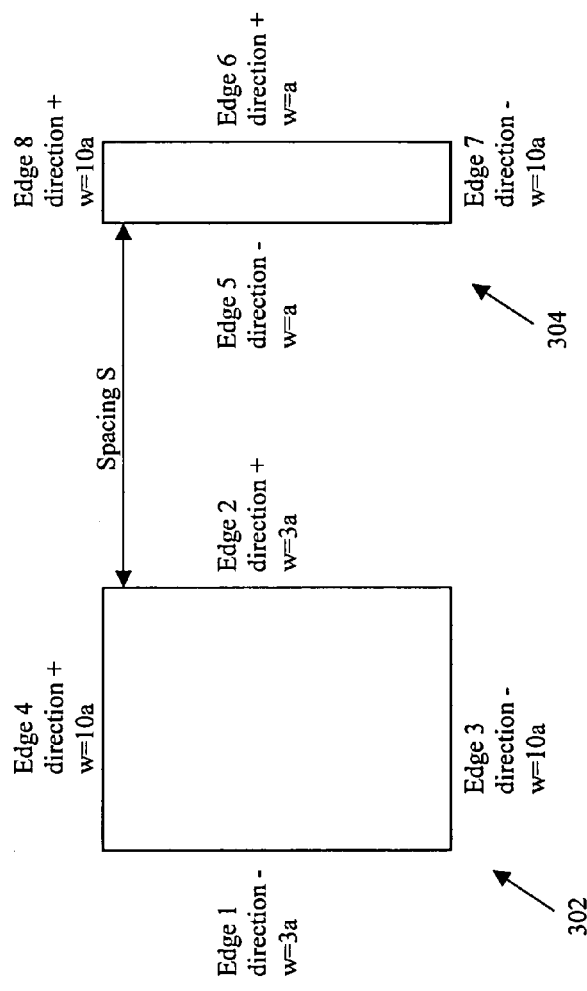
FIG. 3 provides an illustrated example of a two-pass DRC check of width-dependent spacing rules.
Figure 3:
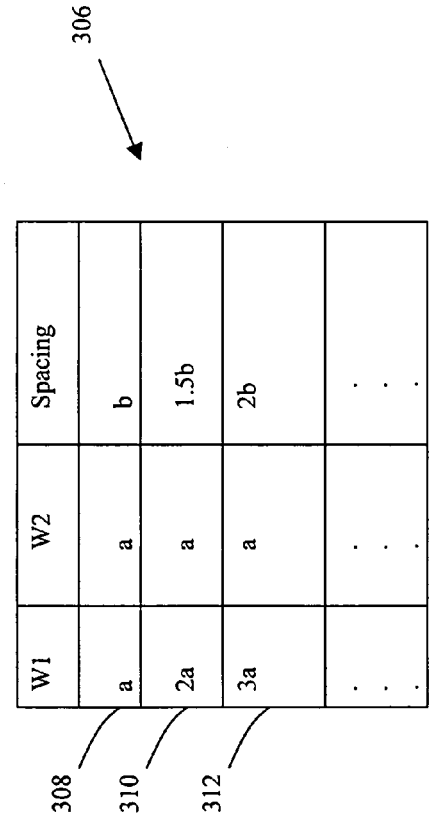

FIG. 3 shows an illustrated example of this process. This figures shows two objects 302 and 304. The first action is to mark the different edges on each one of the polygon sides. Here, for object 302 edge number 1, assume that the width equals 3A. Similarly, for edge number 2 this edge is marked as width equals 3A. Edge numbers 3 and 4 are marked as width equals 10A.

For object 304, edge numbers 5 and 6 have a width equal to a. Edges 7 and 8 each have a width equal to 10a.

The different edges are not only marked by the width that they reflect, but also by the direction of each edge. For purposes of this example, assume that a "−" symbol indicates a direction from the left and bottom directions. A "+" symbol indicates a direction from the right and top directions.

For object 302, edges 1 and 3 are associated with the "−" symbol for direction. Edges 2 and 4 are associated with the "+" symbol for direction.

For object 304, edges 5 and 7 are associated with the "−" symbol for direction. Edges 6 and 8 are associated with the "+" symbol for direction.

A set of spacing rules are identified for the design, e.g., in tabular form. A table 306 is shown in FIG. 3 that contains a number of entries. Each entry is associated with a different set of width parameters for a spacing rule. For example, entry 308 describes a spacing rule of a minimum spacing distance "b" if a first adjacent width is "a" and second adjacent width is also "a". Entry 310 describes a spacing rule of a minimum spacing distance "1.5b" if a first adjacent width is "2a" and second adjacent width is "a". Entry 312 describes a spacing rule of a minimum spacing distance "2b" if a first adjacent width is "3a" and second adjacent width is "a". Any number of such entries may exist for table 306.

The edges on the polygons/objects 302 and 304 are now checked to determine whether they violate any of the spacing rules. In one embodiment, this is performed by checking between positive edges to negative edges on the two objects.

For example, the spacing between edge 2 on object 302 and edge 5 on object 304 can be checked (since edge 2 has a "+" direction symbol and edge 5 has a "−" direction symbol). Here, the first edge 2 has a width of "3a" and the second edge 5 has a width of "a". Therefore, the spacing "S" between the two edges in this configuration can be checked against the spacing rules in table 306. Here, entry 312 in table 306 corresponds to this configuration. Entry 312 indicates that a minimum spacing of "2b" must exist in a first adjacent edge has a width of "3a" and a second adjacent width of "a". Therefore, spacing "S" can be checked to determine if meets this minimum spacing. If not, then a rule violation has been identified.

Figure 4:
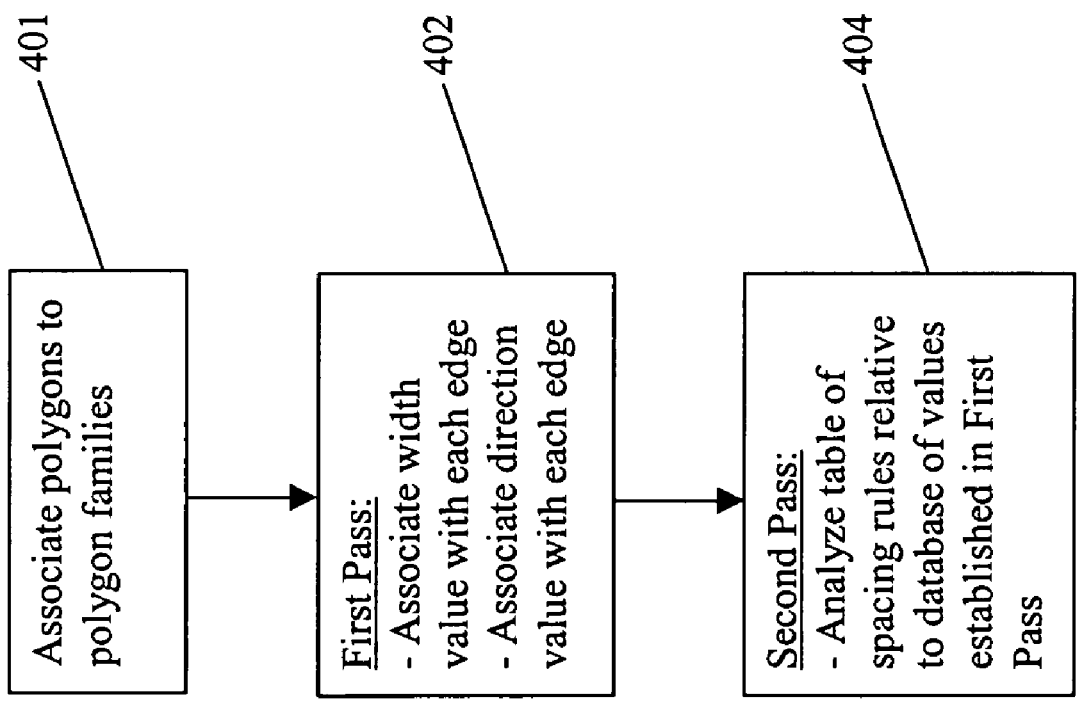
FIG. 4 shows another process flow of an approach for width-dependent spacing rule checking in a DRC tool in accordance with some embodiments of the invention.

FIG. 4 shows a process flow of another approach for width-dependent spacing rule checking in a DRC tool in accordance with some embodiments. At 401, an identification or association is made of different polygon combinations. It is noted that there are as limited number of different shape and polygon combinations in the IC design and the same check does not need to be performed multiple times for the same polygon combinations. Therefore, by making the identifications/associations in 401, each family or combination of polygons can be checked once (or more than once as warranted by the design circumstances), but the check results may be shared by the associated family of polygons.

In the first pass 402 of the process of FIG. 4, similar to above, the objects in the design are analyzed to identify the width value and directional value for each appropriate edge in the design. Once this action as been performed, a database of edge values will now exist for all relevant edges in the IC design. A set of spacing rules is established for the design, which is likely based upon a set of design rules provided by the foundry that will be manufacturing the IC device. The set of spacing rules may exist in tabular form in one embodiment.

The second pass 404 through the IC design comprises a analysis of the database of edge values with respect to the set of spacing rules. Each set of corresponding edges (which are identified based upon the directional value for the edges) are matched against the set of spacing rules.

The first pass 402 and second pass 404 may be performed and the results shared among a respective family of polygons identified in 401. In this manner, the actions of 402 and 404 need not be performed for each and every object in the IC design.

SYSTEM ARCHITECTURE OVERVIEW

Figure 5:
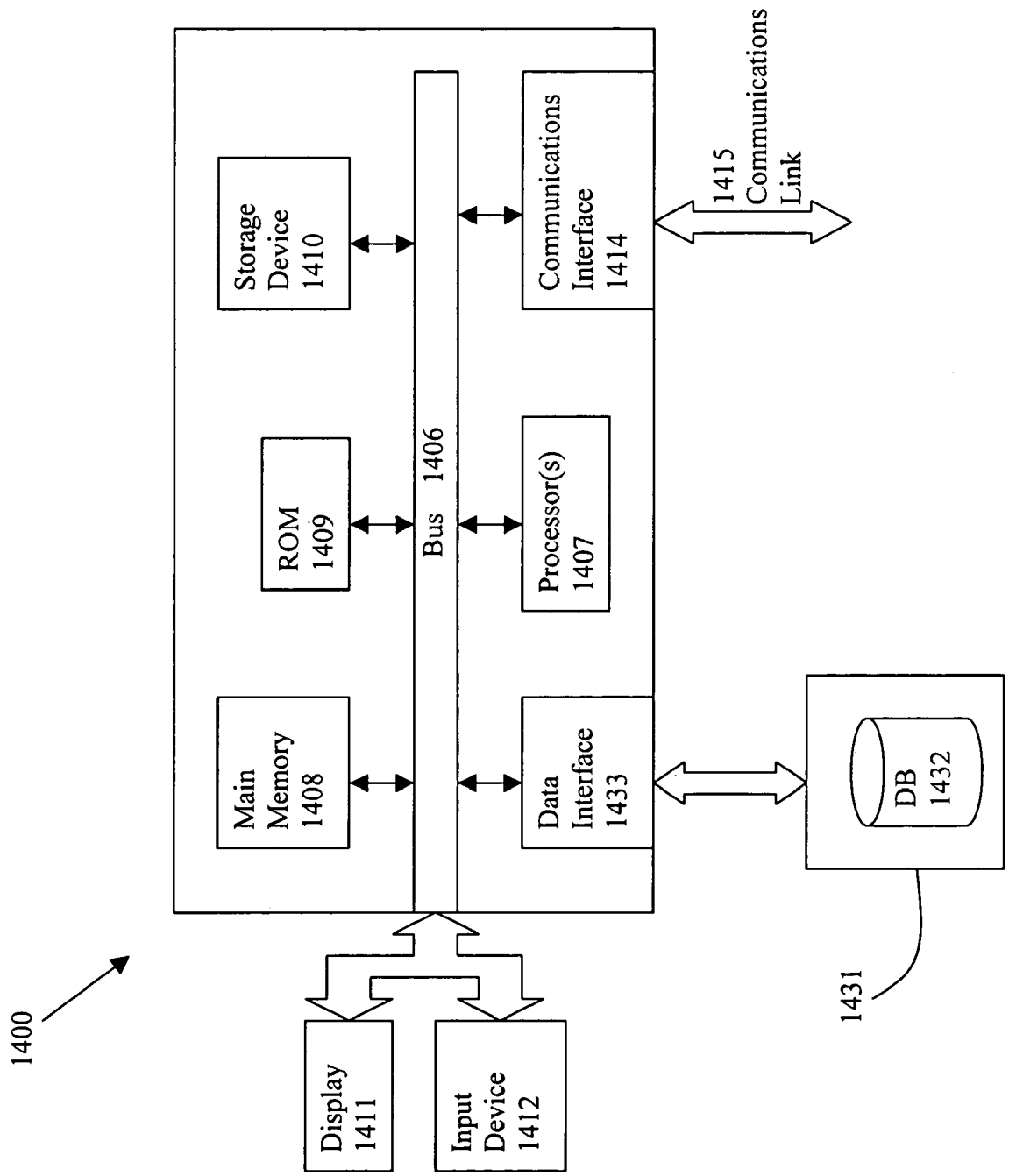
FIG. 5 illustrates an example computing architecture with which embodiments of the invention may be practiced.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modern or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method of performing a check of width-dependent spacing rules, comprising:
   identifying a set of spacing rules for the IC design, wherein each spacing rule is associated with at least two edge values;
   performing a first verification pass through an IC design to identify information about a first edge of a first object in the IC design and a second edge of a second object in the IC design, wherein the identified information for the first edge is stored as a first edge value and the identified information for the second edge is stored as a second edge value, wherein the first verification pass comprises a first discrete set of verification operations applied against the objects in which the information comprises width information and direction information;
   performing a second verification pass to analyze a spacing between the first edge and the second edge, wherein the spacing is checked by matching the first and second edge values identified during the first verification pass against the identified spacing rules based upon the identified associated edge values, wherein the second verification pass comprises a second discrete set of verification operations applied against the objects and width dependent spacing rules are identified in which the width dependent spacing rules are analyzed relative to the information about the edges; and
   displaying a result of the analysis or storing the result in a tangible medium.

2. The method of claim 1 in which the width dependent spacing rules are identified in a table.

3. The method of claim 2 in which the width dependent spacing rules in the table are analyzed relative to the information about the edges.

4. The method of claim 1 in which the second pass identifies violations of the spacing rules.

5. The method of claim 1 further comprising:
   associating a polygon with a family of polygons.

6. The method of claim 5 in which the first and second passes are performed only once for a polygon in the family of polygons.

7. The method of claim 6 in which the analysis data is shared among the family of polygons.

8. A system for performing a check of width-dependent spacing rules, comprising:
   identifying a set of spacing rules for the IC design, wherein each spacing rule is associated with at least two edge values;
   means for performing a first verification pass through an IC design to identify information about a first edge of a first object in the IC design and a second edge of a second object in the IC design, wherein the identified information for the first edge is stored as a first edge value and the identified information for the second edge is stored as a second edge value, wherein the first verification pass comprises a first discrete set of verification operations applied against the objects in which the information comprises width information and direction information;
   means for performing a second verification pass to analyze a spacing between the first edge and the second edge, wherein the spacing is checked by matching the first and second edge values identified during the first verification pass against the identified spacing rules based upon the identified associated edge values, wherein the second verification pass comprises a second discrete set of verification operations applied against the objects and width dependent spacing rules are identified in which the width dependent spacing rules are analyzed relative to the information about the edges; and
   displaying a result of the analysis or storing the result in a tangible medium.

9. The system of claim 8 in which the width dependent spacing rules are identified in a table.

10. The system of claim 9 in which the width dependent spacing rules in the table are analyzed relative to the information about the edges.

11. The system of claim 8 in which the second pass identifies violations of the spacing rules.

12. The system of claim 8 further comprising:
    means for associating a polygon with a family of polygons.

13. The system of claim 12 in which the first and second passes are performed only once for a polygon in the family of polygons.

14. The system of claim 13 in which the analysis data is shared among the family of polygons.

15. A computer program product comprising a tangible computer usable medium having executable code by a processor for performing a check of width-dependent spacing rules, the process comprising:
    identifying a set of spacing rules for the IC design, wherein each spacing rule is associated with at least two edge values;
    performing a first verification pass through an IC design to identify information about a first edge of a first object in the IC design and a second edge of a second object in the IC design, wherein the identified information for the first edge is stored as a first edge value and the identified information for the second edge is stored as a second edge value, wherein the first verification pass comprises a first discrete set of verification operations applied against the objects in which the information comprises width information and direction information;
    performing a second verification pass to analyze a spacing between the first edge and the second edge, wherein the spacing is checked by matching the first and second edge values identified during the first verification pass against the identified spacing rules based upon the identified associated edge values, wherein the second verification pass comprises a second discrete set of verification operations applied against the objects and width dependent spacing rules are identified in which the width dependent spacing rules are analyzed relative to the information about the edges; and
    displaying a result of the analysis or storing the result in a tangible medium.

16. The computer program product of claim 15 in which the width dependent spacing rules are identified in a table.

17. The computer program product of claim 16 in which the width dependent spacing rules in the table are analyzed relative to the information about the edges.

18. The computer program product of claim 15 in which the second pass identifies violations of the spacing rules.

19. The computer program product of claim 15 further comprising:

associating a polygon with a family of polygons.

20. The computer program product of claim 19 in which the first and second passes are performed only once for a polygon in the family of polygons.

21. The computer program product of claim 20 in which the analysis data is shared among the family of polygons.

* * * * *